(12) United States Patent
Lindsay et al.

(10) Patent No.: US 6,759,298 B2
(45) Date of Patent: Jul. 6, 2004

(54) METHODS OF FORMING AN ARRAY OF FLASH FIELD EFFECT TRANSISTORS AND CIRCUITRY PERIPHERAL TO SUCH ARRAY

(75) Inventors: Roger W Lindsay, Boise, ID (US); Mark A. Helm, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 162 days.

(21) Appl. No.: 10/179,868

(22) Filed: Jun. 24, 2002

(65) Prior Publication Data

US 2003/0235963 A1 Dec. 25, 2003

(51) Int. Cl.[7] .............................................. H01L 21/336
(52) U.S. Cl. ....................... 438/258; 438/257; 438/259; 438/263; 438/264
(58) Field of Search ................................ 438/264, 259, 438/257, 263, 261, 258

(56) References Cited

U.S. PATENT DOCUMENTS

| | | | | | |
|---|---|---|---|---|---|
| 5,102,814 | A | * | 4/1992 | Woo ............................ | 438/263 |
| 5,298,447 | A | * | 3/1994 | Hong .......................... | 438/264 |
| RE35,094 | E | * | 11/1995 | Wu et al. .................... | 438/264 |
| 5,674,672 | A | * | 10/1997 | Kawamoto .................. | 430/533 |
| 6,133,602 | A | * | 10/2000 | Shrivastava et al. ......... | 257/314 |
| 6,245,613 | B1 | * | 6/2001 | Hsu et al. .................... | 438/259 |
| 6,265,267 | B1 | | 7/2001 | Huang | |
| 6,268,250 | B1 | | 7/2001 | Helm | |
| 6,323,532 | B1 | * | 11/2001 | Joachim et al. ............. | 257/510 |
| 6,355,526 | B1 | | 3/2002 | Furuhata | |
| 6,380,031 | B1 | | 4/2002 | Mehrad et al. | |
| 6,396,100 | B2 | | 5/2002 | Helm | |
| 6,461,916 | B1 | * | 10/2002 | Adachi et al. .............. | 438/257 |
| 6,509,225 | B2 | | 1/2003 | Moriwaki et al. | |
| 6,579,762 | B2 | | 6/2003 | Io | |
| 6,579,763 | B1 | * | 6/2003 | Lindsay ...................... | 438/258 |
| 6,589,843 | B1 | * | 7/2003 | Beaman ...................... | 438/261 |
| 6,645,814 | B1 | * | 11/2003 | Lindsay et al. ............. | 438/258 |
| 2001/0004330 | A1 | | 6/2001 | Nam et al. | |
| 2002/0100930 | A1 | | 8/2002 | Yaegashi | |
| 2002/0127794 | A1 | | 9/2002 | Hashimoto et al. | |
| 2003/0008458 | A1 | | 1/2003 | Hashimoto et al. | |
| 2003/0036234 | A1 | | 2/2003 | Doi | |
| 2003/0235956 | A1 | * | 12/2003 | Lindsay et al. ............. | 438/264 |

OTHER PUBLICATIONS

Kim et al, *Process Design for Preventing the Gate Oxide Thinning in the Integration of Dual Gate Oxide Transistor*, 41 Jpn. J. Appl. Phys., Part 1, No. 4B, pp. 2404–2409 (Apr. 2002).

* cited by examiner

*Primary Examiner*—Michael Lebentritt
(74) *Attorney, Agent, or Firm*—Wells St. John P.S.

(57) ABSTRACT

A method of forming an array of FLASH field effect transistors and circuitry peripheral to such array includes forming a sacrificial oxide over an array area and a periphery area of a semiconductor substrate. After forming the sacrificial oxide, at least one conductivity modifying implant is conducted into semiconductive material of the substrate within the array without conducting the one conductivity modifying implant into semiconductive material of the substrate within the periphery. The sacrificial oxide is removed from the array while the sacrificial oxide is left over the periphery. After removing the sacrificial oxide from the array, at least some FLASH transistor gates are formed within the array and at least some non-FLASH transistor gates are formed within the periphery.

48 Claims, 7 Drawing Sheets

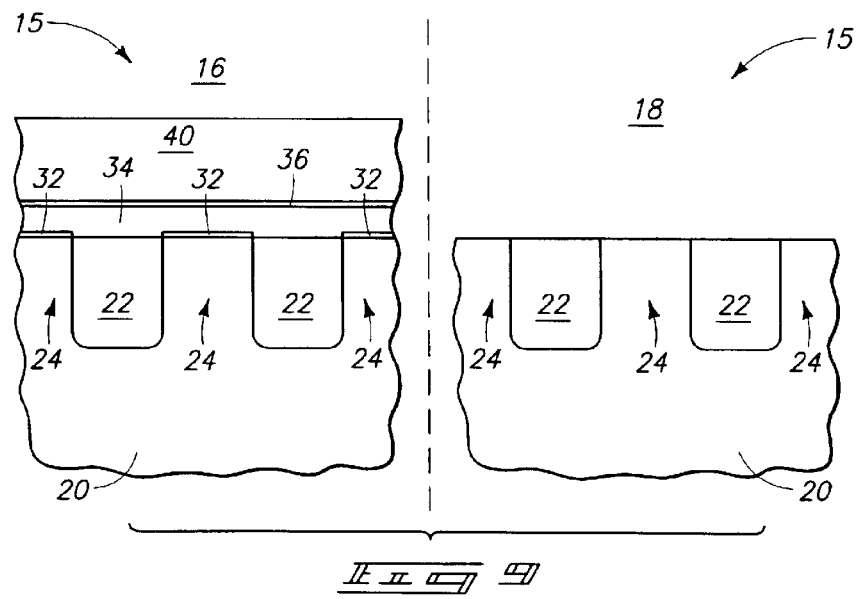
F I G 9
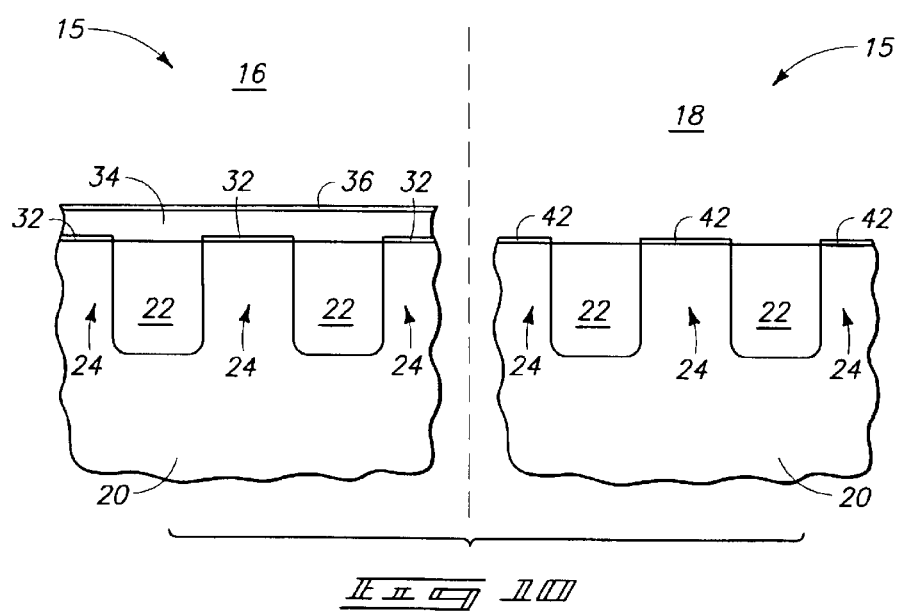
F I G 10

METHODS OF FORMING AN ARRAY OF FLASH FIELD EFFECT TRANSISTORS AND CIRCUITRY PERIPHERAL TO SUCH ARRAY

TECHNICAL FIELD

This invention relates to methods of forming an array of FLASH field effect transistors and circuitry peripheral to such array.

BACKGROUND OF THE INVENTION

Memory is but one type of integrated circuitry. Some memory circuitry allows for both on-demand data storage and data retrieval. For example, memories which allow both writing and reading, and whose memory cells can be accessed in a random order independent of physical location, are referred to as random-access memories (RAM). Read-only memories (ROMs) are those in which only the read operation can be performed rapidly. Entering data into a read-only memory is typically referred to as programming, and the operation is considerably slower than the writing operation utilized in random-access memory. With random-access memory, information is typically stored with respect to each memory cell either through charging of a capacitor or the setting of a state of a bi-stable flip-flop circuit. With either, the stored information is destroyed when power is interrupted. Read-only memories are typically non-volatile, with the data being entered during manufacturing or subsequently during programming.

Some read-only memory devices can be erased as well as written to by a programmer. Erasable read-only memory typically depends on the long-term retention of electronic charge as the information storage mechanism. The charge is typically stored on a floating semiconductive gate, such as polysilicon. One type of read-only memory comprises FLASH memory. Such memory can be selectively erased rapidly through the use of an electrical erase signal.

A FLASH memory cell typically comprises a single floating gate transistor. For multiple storage cells, such as used in large semiconductor memories, the storage cells of the memory are arranged in an array consisting of rows and columns. The rows are typically considered as comprising individual conductive gate lines formed as a series of spaced floating gates received along a single conductive line (hereafter referred to as "a line of floating gates"). Source and drain regions of the cells are formed relative to active area of a semiconductor substrate, with the active areas being generally formed in lines running substantially perpendicular to the lines of floating gates. The sources and drains are formed on opposing sides of the lines of floating gates within the active area with respect to each floating gate of the array. Thus, lines (rows) of programmable transistors are formed.

Electrical connections are made with respect to each drain to enable separate accessing of each memory cell. Such interconnections are arranged in lines comprising the columns of the array. The sources in FLASH memory, however, are typically all interconnected and provided at one potential, for example ground, throughout the array. Accordingly, the source regions along a given line of floating gates are typically all provided to interconnect within the substrate in a line running parallel and immediately adjacent the line of floating gates. These regions of continuously running source area are interconnected outside of the array, and strapped to a suitable connection for providing the desired potential relative to all the sources within the array.

FLASH memory fabrication typically includes an array of FLASH field effect transistors and circuitry which is peripheral to the array. Array FLASH field effect transistors and periphery field effect transistors typically have different gate dielectric or gate oxide thicknesses, and accordingly, are typically fabricated at different times. Usually, the periphery gate dielectric is generally thicker than the array gate dielectric due to higher voltage operation of periphery transistors as compared to that of the array. The periphery gate dielectric can be fabricated after the fabrication of the array gate dielectric. Unfortunately, this results in the typical isolation oxide within the periphery being subjected to a greater quantity of oxide etchings than occurs relative to the isolation oxide within the array. This can result in significant exposure of a corner of silicon where the active area meets the substrate isolation where a transistor gate passes from over active area to over isolation oxide. This can adversely affect the circuitry in operation.

FIG. 1 depicts the problem just described. A semiconductor wafer fragment 10 is shown as appearing in a periphery circuit area to an array of FLASH field effect transistors (not shown) being fabricated. Such comprises a bulk active area substrate region 11 having an adjacent region of trench isolation oxide 12. To produce the active area and trench or other field isolation, typical prior art processing would first deposit a pad oxide layer over the substrate and then a silicon nitride comprising layer thereover. The pad oxide and silicon nitride layer would be patterned and etched relative to the bulk substrate to define and form exposed isolation areas of the bulk substrate. With trench isolation, trenches would be etched into the bulk substrate and subsequently filled with an insulative isolation material, for example silicon dioxide. The substrate is then polished and/or etched effective to remove at least the masking silicon nitride and expose or etch through the pad oxide. The periphery is then masked, typically with photoresist, with the array left exposed. One or more conductivity modifying implants are then conducted into semiconductive material of the substrate within the array. Exemplary such implants include $V_t$ threshold implants and channel enhancement implants.

The mask is subsequently stripped and the entire substrate subjected to a thermal oxidation to form a sacrificial oxide. Typically, such oxide is grown to correct defects and otherwise improve the semiconductive material substrate outer portion/surface for a subsequent gate oxide growth. Thereafter, the sacrificial oxide and any remaining pad oxide are stripped from the substrate. Gate oxide is then formed which is optimized for the array, but/and also grows over the periphery in a blanket manner. Floating gate material is then deposited, with the array then being patterned in at least one dimension towards formation of the floating gates. In such patterning, all such floating control gate material and the gate dielectric are typically etched from the periphery.

Next, another gate dielectric (typically an oxide-nitride-oxide composite) is formed over the control gate material within the array, and accordingly, blanketly over the substrate and, therefore, within the periphery. The array is then masked, and then the gate dielectric formed in the periphery is stripped.

All of the above-described sacrificial oxidation stripping, first gate oxide stripping and second gate oxide stripping within the periphery has a tendency to form a recess 13 (FIG. 1) where isolation oxide 12 meets with active area bulk semiconductive material 11. Typically, a gate oxide layer 14 is formed next, optimized for the periphery field effect transistors. Such can result in the illustrated gate oxide thinning over the active area bulk material corner. This can lead to adverse operation of the circuitry in operation.

The invention was motivated in addressing the above-described issues and improving upon the above-described drawbacks. However, it is in no way so limited. The invention is only limited by the accompanying claims as literally worded (without interpretative or other limiting reference to the above background art description, remaining portions of the specification or the drawings) and in accordance with the doctrine of equivalents.

SUMMARY

The invention includes methods of forming an array of FLASH field effect transistors and circuitry peripheral to such array. In one implementation, a method of forming an array of FLASH field effect transistors and circuitry peripheral to such array includes forming a sacrificial oxide proximate a pad oxide within an array area and a periphery area of a semiconductor substrate prior to conducting at least one $V_t$ or channel enhancement implant into the array while the periphery is masked.

In one implementation, a method of forming an array of FLASH field effect transistors and circuitry peripheral to such array includes forming a sacrificial oxide over an array area and a periphery area of a semiconductor substrate. After forming the sacrificial oxide, at least one conductivity modifying implant is conducted into semiconductive material of the substrate within the array without conducting the one conductivity modifying implant into semiconductive material of the substrate within the periphery. The sacrificial oxide is removed from the array while the sacrificial oxide is left over the periphery. After removing the sacrificial oxide from the array, at least some FLASH transistor gates are formed within the array and at least some non-FLASH transistor gates are formed within the periphery.

Other aspects and implementations are contemplated.

BRIEF DESCRIPTION OF THE DRAWINGS

Preferred embodiments of the invention are described below with reference to the following accompanying drawings.

FIG. 9 is a view of the FIG. 8 wafer fragment at a processing step subsequent to that shown by FIG. 8.

FIG. 10 is a view of the FIG. 9 wafer fragment at a processing step subsequent to that shown by FIG. 9.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 2:
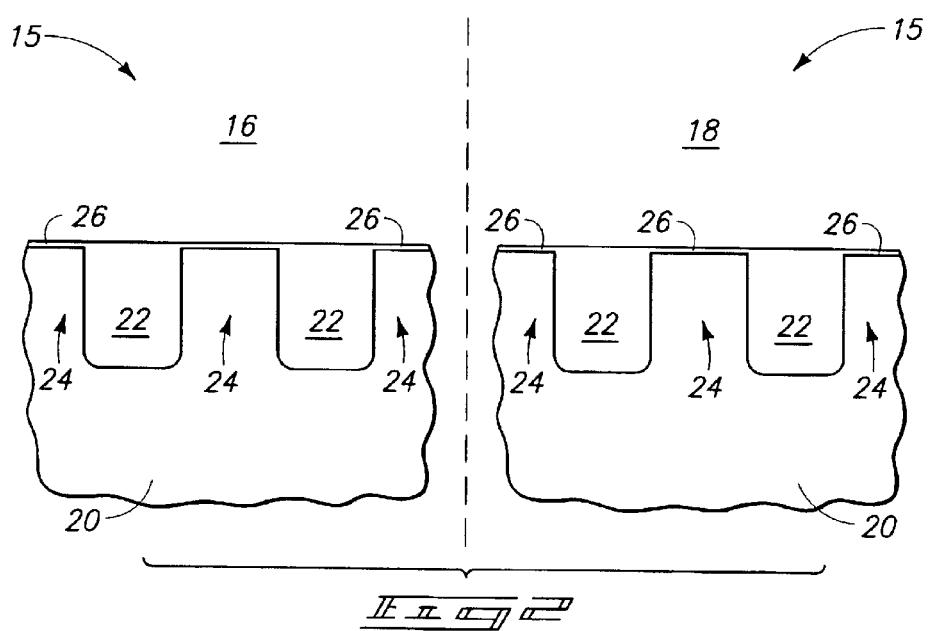
FIG. 2 is a diagrammatic sectional view of a wafer fragment at a processing in accordance with an aspect of the invention.

Methods of forming an array of FLASH field effect transistors and circuitry peripheral to such array are described in preferred embodiments below and, by way of example only, as shown in FIGS. 2–13. Referring initially to FIG. 2, a wafer fragment 15 is depicted as comprising an exemplary array area 16 and a periphery area 18. Substrate 15 comprises a semiconductor substrate 20, preferably constituting bulk monocrystalline silicon. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Also in the context of this document, the term "layer" includes both the singular and the plural unless otherwise indicated.

Bulk substrate 20 has been processed to form field isolation regions 22 and active area 24 therebetween. In the depicted embodiment, field isolation 22 is in the form of trench isolation, with but one example preferred material being silicon dioxide preferably deposited by high density plasma deposition. In the depicted preferred embodiment and as generally described above, such has been formed in part by using a pad oxide 26 which is shown remaining at least over active areas 24. An exemplary thickness for such pad oxide is from 80 Angstroms to 150 Angstroms over active areas 24.

Figure 3:
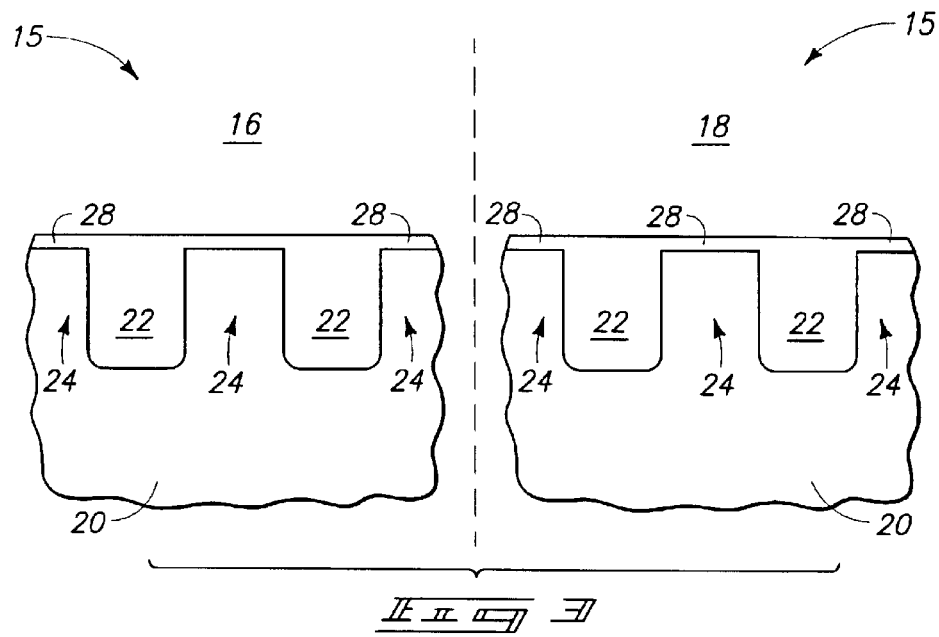
FIG. 3 is a view of the FIG. 2 wafer fragment at a processing step subsequent to that shown by FIG. 2.

Referring to FIG. 3, a sacrificial oxide 28 is globally formed over substrate 15 and, accordingly, over array area 16 and periphery area 18. A preferred method of such is by thermal oxidation and the growing of layer 28 through and proximate the pad oxide, for example, using an atmospheric furnace oxidation at 800° C. utilizing a hydrogen and oxygen containing chemistry. A preferred thickness for sacrificial oxide 28 (including any pad oxide) over the active area is from about 120 Angstroms to about 200 Angstroms.

Figure 4:
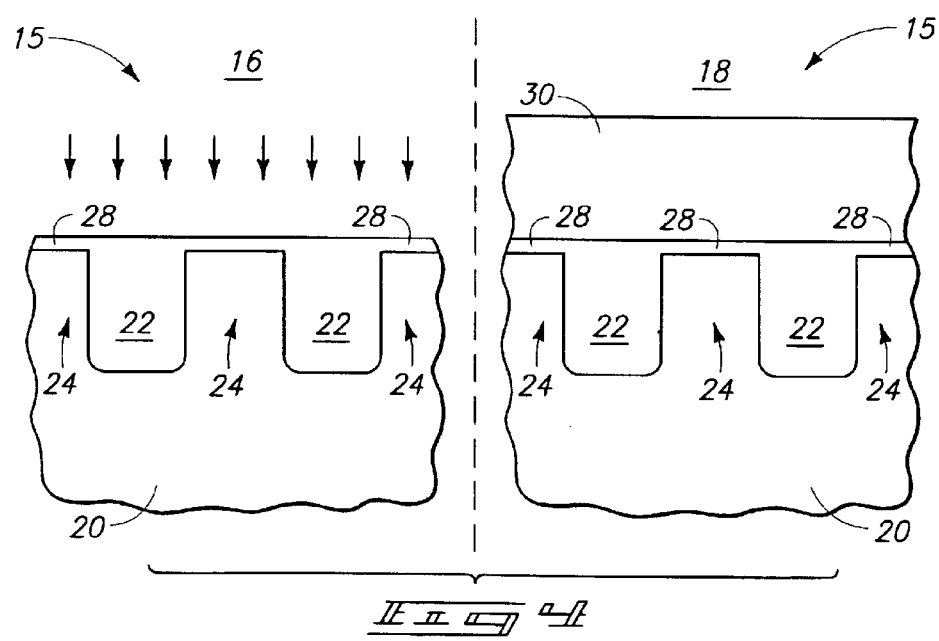
FIG. 4 is a view of the FIG. 3 wafer fragment at a processing step subsequent to that shown by FIG. 3.

Referring to FIG. 4, a first masking 30 is formed over periphery 18 while array 16 is left exposed. In the context of this document and with respect to the just described masking, "first" is used only in the context temporally with respect to a second-in-time masking described subsequently, and not necessarily with respect to a first-ever masking of the substrate. A preferred material for first masking 30 is photoresist.

Still referring to FIG. 4, at least one conductivity modifying implant is conducted into the semiconductive material of the substrate within array 16 (i.e., as indicated by the depicted vertical arrows, by way of example only) through the remaining pad oxide and the sacrificial oxide within array 16 using first masking 30. First masking 30 largely shields substrate material 20 therebeneath from such implant. Example preferred implants include one or both of a $V_t$ implant and a channel enhancement implant. By way of example only, such provides one example of conducting such an implant into the semiconductive material of the substrate within the array without conducting such conductivity modifying implant into the semiconductive material of the substrate within the periphery. Any other method of conducting the same, with or without masking 30 and whether existing or yet-to-be developed, is contemplated in accordance with certain aspects of the invention.

Figure 5:
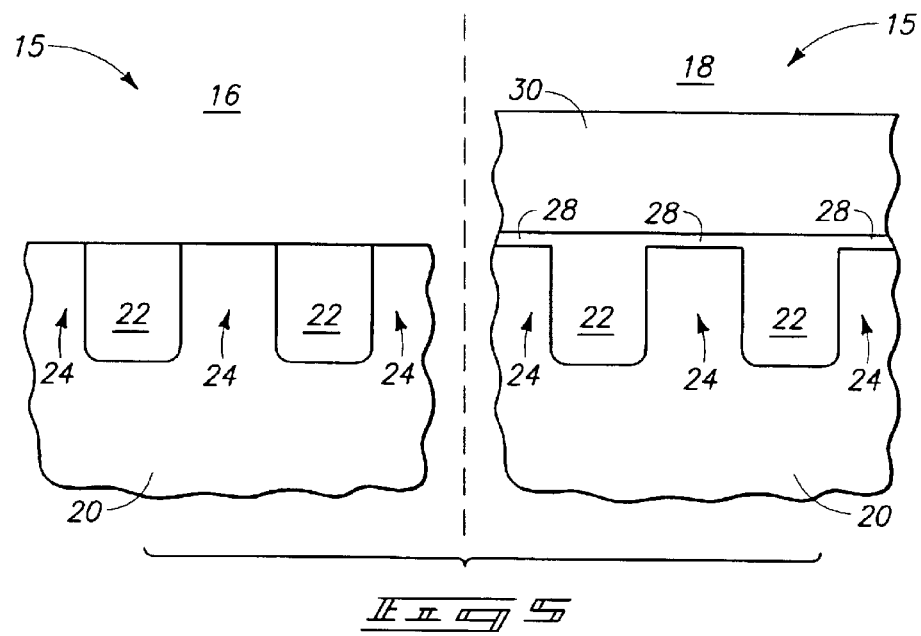
FIG. 5 is a view of the FIG. 4 wafer fragment at a processing step subsequent to that shown by FIG. 4.

Referring to FIG. 5, the sacrificial oxide and any remaining pad oxide have been removed from array 16 while sacrificial oxide 28 is left over periphery 18 using masking 30. Preferably, such removing is by etching using any suitable wet or dry chemistry, such as a wet buffered oxide etch. Such provides but one example of the removing of the sacrificial oxide from the array while leaving sacrificial oxide over the periphery. Of course, any other existing or yet-to-be developed method is contemplated, and regardless of using any masking. The just described and depicted embodiment removes the sacrificial oxide from the array after conducting the described conductivity modifying implant. Alternately, the sacrificial oxide removing could be conducted before conducting such conductivity modifying implant. Further, the depicted and preferred removing is also conducted of any remnant of the pad oxide effective to remove it from the array while leaving such over the periphery.

Figure 6:
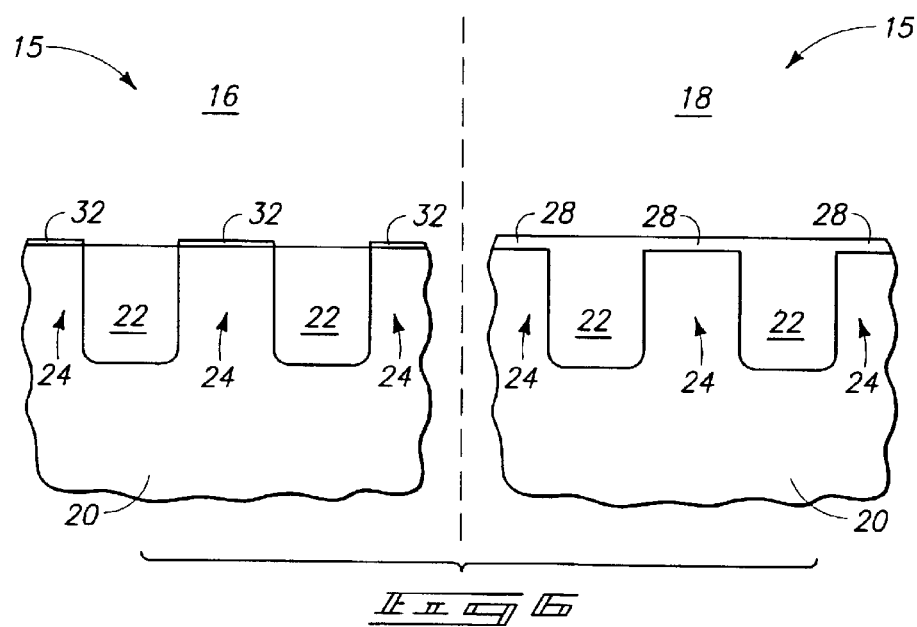
FIG. 6 is a view of the FIG. 5 wafer fragment at a processing step subsequent to that shown by FIG. 5.

Referring to FIG. 6, first masking 30 has been removed from the substrate, and thereafter a gate dielectric 32, typically silicon dioxide, is formed at least within array 16. Typically, such oxide formation is conducted by thermal growth. Further, sacrificial oxide 28 received within periphery 18 preferably restricts the oxidation of the semiconductive material of the substrate during the formation of layer 32 within array 16. An exemplary preferred thickness for layer 32 is from 90 Angstroms to 100 Angstroms.

Figure 7:
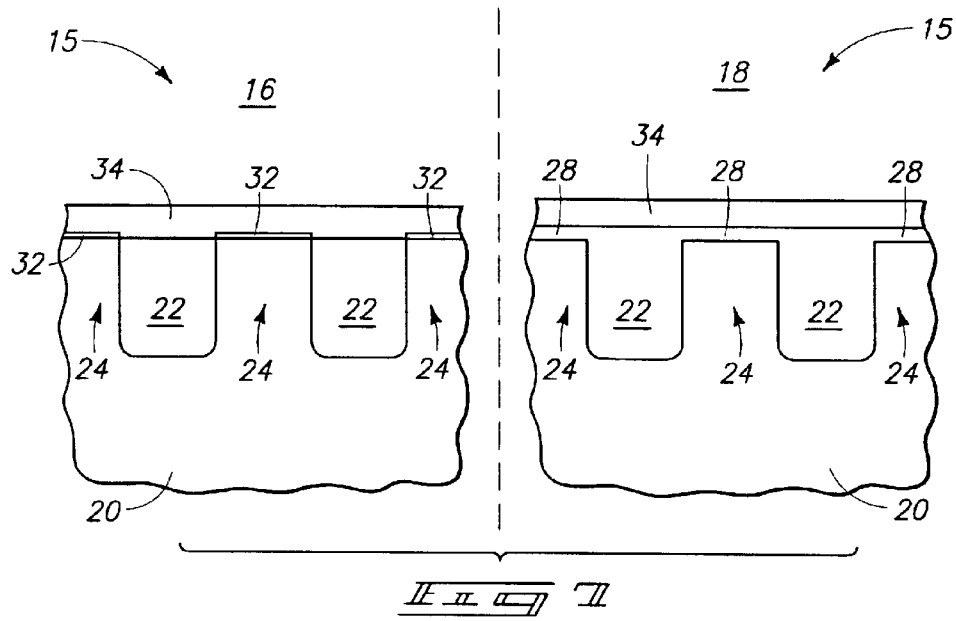
FIG. 7 is a view of the FIG. 6 wafer fragment at a processing step subsequent to that shown by FIG. 6.

Referring to FIG. 7, a floating gate conductively doped semiconductive material 34 is formed at least within array 16 over gate oxide 32 and, as well, over periphery 18 as shown. An example material is polysilicon.

Figure 8:
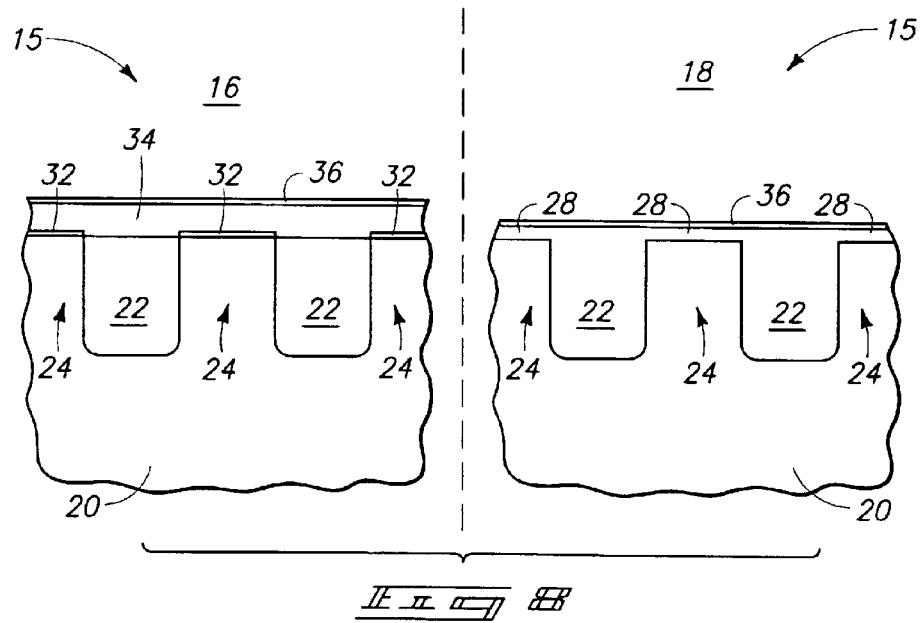
FIG. 8 is a view of the FIG. 7 wafer fragment at a processing step subsequent to that shown by FIG. 7.

Referring to FIG. 8, floating gate conductively doped semiconductive material 34 would typically then be patterned (by way of example only, using photoresist masking and etch) in at least one direction/dimension within array 16, and be removed from periphery 18. Next, a control gate dielectric 36 would be formed over floating gate conductively doped semiconductive material 34 within array 16, and typically accordingly also within periphery 18. An exemplary preferred material 36 is a composite of silicon dioxide-silicon nitride-silicon dioxide layers. Exemplary thicknesses, bottom-to-top are 40 Angstroms, 100 Angstroms and 30 Angstroms, respectively. Accordingly in one preferred embodiment, material 36 comprises at least a control gate oxide layer over floating gate material 34 within array 16.

Referring to FIG. 9, a second masking 40 is formed within array 16. With such masking in place, periphery gate dielectric 36 is removed along with any remaining pad oxide and sacrificial oxide 28 from periphery 18, preferably using at least wet oxide etching. Accordingly, control gate oxide and sacrificial oxide are removed from the periphery while the control gate oxide of the array is masked. An exemplary and preferred material for second masking 40 is photoresist.

Referring to FIG. 10, second masking 40 has been removed and a periphery gate dielectric layer 42 (i.e., silicon dioxide) is formed on monocrystalline silicon 20 of active area 24 within periphery 18. As referred to above, the periphery gate dielectric is preferably optimized for the periphery field effect transistors, and is preferably thicker than that for the array floating gates. An exemplary preferred thickness for gate dielectric 42 is from 120 Angstroms to 200 Angstroms.

Figure 11:
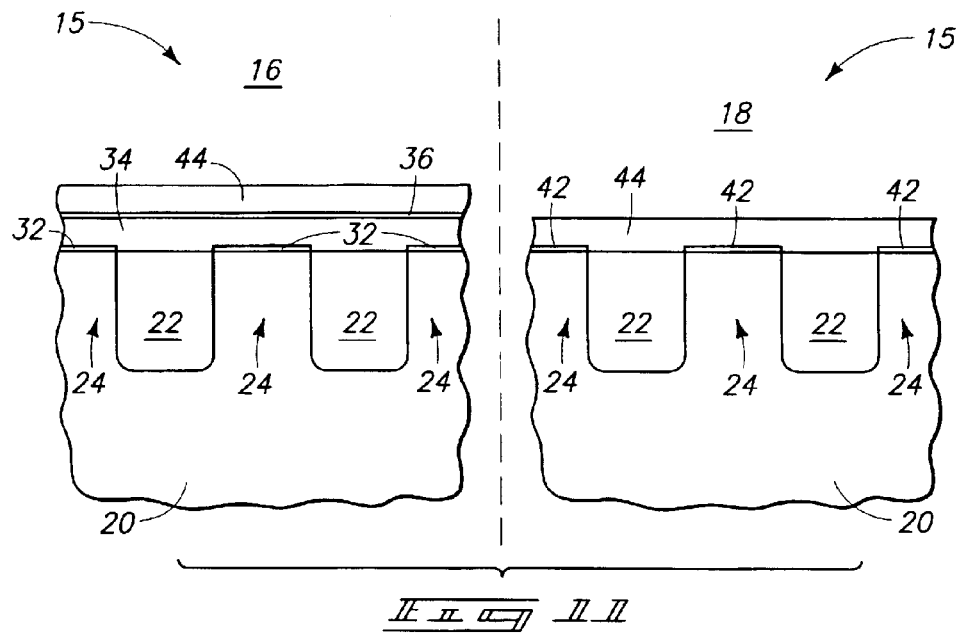
FIG. 11 is a view of the FIG. 10 wafer fragment at a processing step subsequent to that shown by FIG. 10.

Referring to FIG. 11, a conductively doped semiconductive material 44 (i.e., polysilicon) is formed over array 16 and periphery 18.

Figure 12:
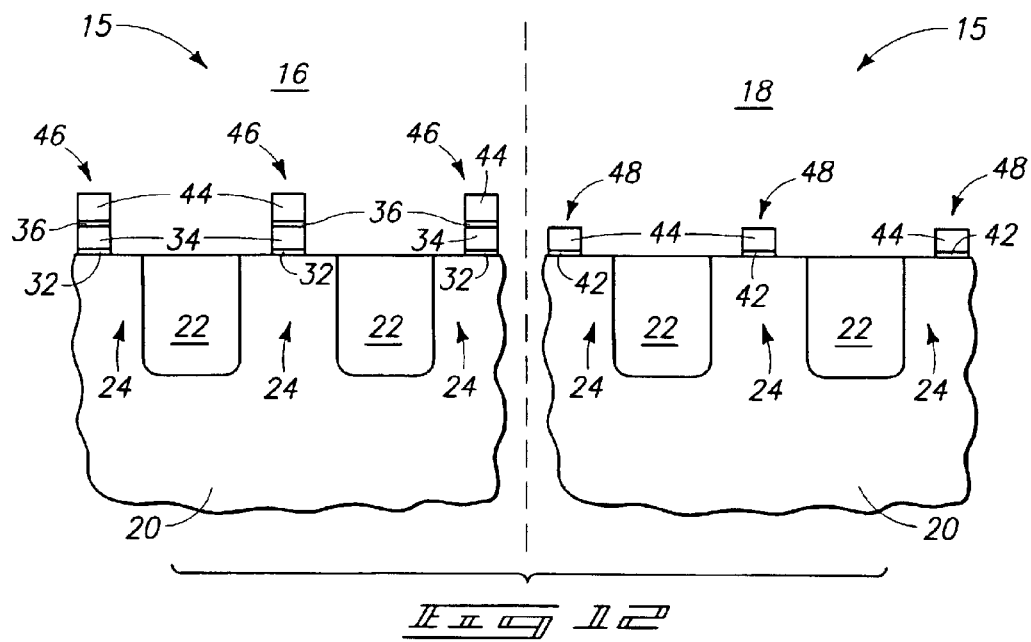
FIG. 12 is a view of the FIG. 11 wafer fragment at a processing step subsequent to that shown by FIG. 11.

Referring to FIG. 12, the depicted FIG. 11 materials have been patterned into at least some FLASH control transistor gate lines 46 within array 16, and into at least some non-FLASH transistor gate lines 48 within periphery 18. Source/drains would also be formed.

Figure 1:
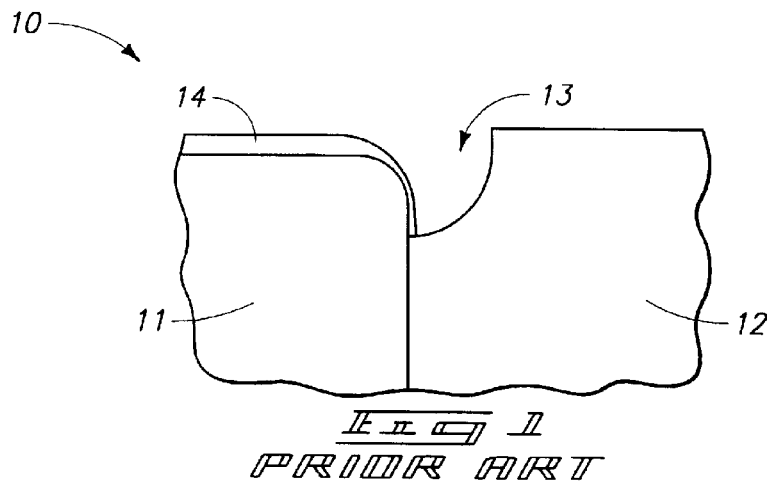
FIG. 1 is a diagrammatic sectional view of a prior art wafer fragment.
Figure 13:
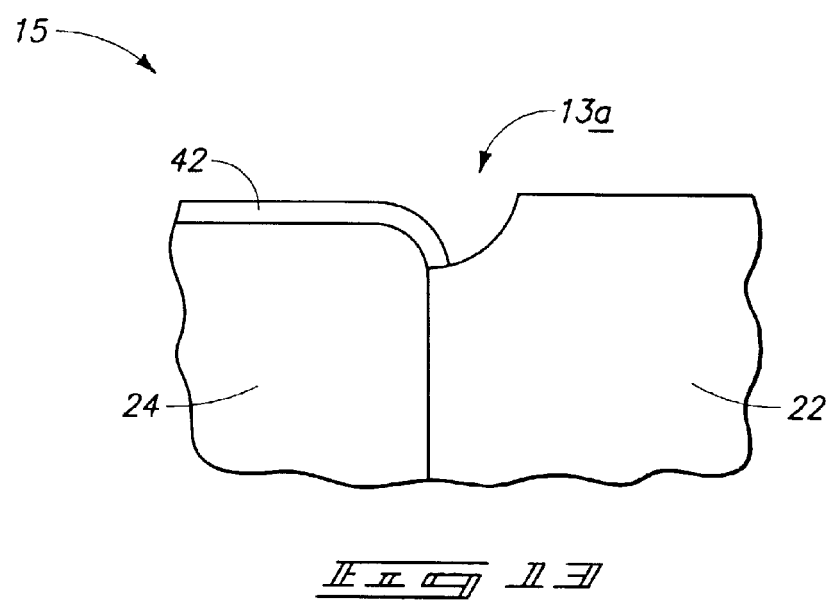
FIG. 13 is an enlarged diagrammatic sectional view of a portion of a wafer fragment processed in accordance with an aspect of the invention.

By way of example only, such provides one example of forming at least some FLASH transistor gates within the array, and at least some non-FLASH transistor gates within the periphery. In one preferred embodiment where at least some non-FLASH transistor gates of the periphery comprise gate oxide, the above-described method reduces thinning of the gate oxide proximate the trench field isolation oxide within the active area within the periphery than would otherwise occur under identical processing but for forming the sacrificial oxide prior to conducting the at least one conductivity modifying implant. By way of example only, FIG. 13 depicts in enlarged view a preferred intended effect of such reduced gate oxide thinning in comparison to that shown by FIG. 1. FIGS. 1 and 13 depict enlarged sectional views taken at ninety degrees to those diagrammatically shown in FIGS. 2–12.

In one independent aspect, the above can independently be considered as but one exemplary method of forming an array of FLASH field effect transistors and circuitry peripheral to such array, which includes forming a sacrificial oxide proximate a pad oxide within an array area and a periphery area of a semiconductor substrate prior to conducting at least one $V_t$ or channel enhancement implant into the array while the periphery is masked. Any other methods as just so literally stated, whether existing or yet-to-be developed, are contemplated. Preferably, such sacrificial oxide forming is conducted prior to conducting any $V_t$ or channel enhancement implant into the array while the periphery is masked.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of forming an array of FLASH field effect transistors and circuitry peripheral to such array, comprising:

forming a sacrificial oxide over an array area and a periphery area of a semiconductor substrate;

after forming the sacrificial oxide, conducting at least one conductivity modifying implant into semiconductive material of the substrate within the array area without conducting the one conductivity modifying implant into semiconductive material of the substrate within the periphery area;

removing the sacrificial oxide from the array area while leaving the sacrificial oxide over the periphery area; and after removing the sacrificial oxide from the array area, forming at least some FLASH transistor gates within the array area and at least some non-FLASH transistor gates within the periphery area.

2. The method of claim 1 wherein the removing is conducted after the conductivity modifying implant.

3. The method of claim 1 wherein the removing is conducted before the conductivity modifying implant.

4. The method of claim 1 comprising forming active area and field isolation prior to forming the sacrificial oxide.

5. The method of claim 1 comprising masking the periphery area with photoresist during conducting said at least one conductivity modifying implant.

6. The method of claim 1 wherein the conductivity modifying implant is a Vt implant.

7. The method of claim 1 wherein the conductivity modifying implant is a channel enhancement implant.

8. The method of claim 1 comprising forming a pad oxide layer over the substrate prior to forming the sacrificial oxide.

9. The method of claim 1 wherein the removing is by etching.

10. The method of claim 1 comprising forming a pad oxide layer over the substrate prior to forming the sacrificial oxide, the removing comprising etching, said etching also being conducted of said pad oxide layer effective to remove said pad oxide from the array area while leaving said pad oxide over the periphery area.

11. The method of claim 1 wherein the sacrificial oxide forming is globally over the array area and the periphery area.

12. The method of claim 1 wherein the sacrificial oxide forming is globally over the substrate.

13. The method of claim 1 comprising forming a control gate oxide layer over the array area and the periphery area, and removing the control gate oxide and the sacrificial oxide from the periphery area while said control gate oxide layer of the array area is masked.

14. The method of claim 1 wherein the at least some non-FLASH transistor gates of the periphery area comprise gate oxide, and comprising forming active area and trench field isolation oxide prior to forming the sacrificial oxide, the method reducing thinning of said gate oxide proximate the trench field isolation oxide within the active area within the periphery area than would otherwise occur under identical processing but for forming said sacrificial oxide prior to conducting said at least one conductivity modifying implant.

15. The method of claim 1 comprising forming the non-FLASH transistor gates within the periphery area to have greater thickness gate dielectric than that of the FLASH transistor gates within the array area.

16. The method of claim 1 comprising forming the non-FLASH transistor gates within the periphery area to have greater thickness gate dielectric than that of the FLASH transistor gates within the array area, and forming the gate dielectric of the array area FLASH transistors prior to forming the gate dielectric of the periphery area non-FLASH transistors.

17. A method of forming an array of FLASH field effect transistors and circuitry peripheral to such array, comprising:
   forming a sacrificial oxide over an array area and a periphery area of a semiconductor substrate;
   after forming the sacrificial oxide, masking the periphery area while leaving the array area exposed, and then conducting at least one conductivity modifying implant into semiconductive material of the substrate within the array area using said masking;
   using said masking, removing the sacrificial oxide from the array area while leaving the sacrificial oxide over the periphery area;
   after removing the sacrificial oxide from the array, removing the masking; and
   after removing the masking, forming at least some FLASH transistor gates within the array area and at least some non-FLASH transistor gates within the periphery area.

18. The method of claim 17 comprising forming active area and field isolation prior to forming the sacrificial oxide.

19. The method of claim 17 wherein the sacrificial oxide removing is conducted after the conductivity modifying implant.

20. The method of claim 17 wherein the sacrificial oxide removing is conducted before the conductivity modifying implant.

21. The method of claim 17 wherein the conductivity modifying implant is a Vt implant.

22. The method of claim 17 wherein the conductivity modifying implant is a channel enhancement implant.

23. The method of claim 17 comprising forming a pad oxide layer over the substrate prior to forming the sacrificial oxide.

24. The method of claim 17 wherein the removing is by etching.

25. The method of claim 17 comprising forming a pad oxide layer over the substrate prior to forming the sacrificial oxide, the removing comprising etching, said etching also being conducted of said pad oxide layer effective to remove said pad oxide from the array area while leaving said pad oxide over the periphery area.

26. The method of claim 17 comprising forming a control gate oxide layer over the array area and the periphery area, and removing the control gate oxide and the sacrificial oxide from the periphery area while said control gate oxide layer of the array area is masked.

27. The method of claim 17 wherein the at least some non-FLASH transistor gates of the periphery area comprise gate oxide, and comprising forming active area and trench field isolation oxide prior to forming the sacrificial oxide, the method reducing thinning of said gate oxide proximate the trench field isolation oxide within the active area within the periphery area than would otherwise occur under identical processing but for forming said sacrificial oxide prior to conducting said at least one conductivity modifying implant.

28. The method of claim 17 comprising forming the non-FLASH transistor gates within the periphery area to have greater thickness gate dielectric than that of the FLASH transistor gates within the array area.

29. The method of claim 17 comprising forming the non-FLASH transistor gates within the periphery area to have greater thickness gate dielectric than that of the FLASH transistor gates within the array area, and forming the gate dielectric of the array area FLASH transistors prior to forming the gate dielectric of the periphery area non-FLASH transistors.

30. A method of forming an array area of FLASH field effect transistors and circuitry peripheral to such array area comprising forming a sacrificial oxide proximate a pad oxide within an array area and a periphery area of a semiconductor substrate prior to conducting at least one Vt or channel enhancement implant into the array area while the periphery area is masked.

31. The method of claim 30 wherein the sacrificial oxide forming is conducted prior to conducting any Vt or channel enhancement implant into the array area while the periphery area is masked.

32. The method of claim 30 comprising forming a transistor gate comprising gate oxide within the periphery area, and comprising forming active area and trench field isolation oxide prior to forming the sacrificial oxide, the method reducing thinning of said gate oxide proximate the trench field isolation oxide within the active area within the periphery area than would otherwise occur under identical processing but for forming said sacrificial oxide prior to conducting said at least one Vt or channel enhancement implant.

33. The method of claim 30 wherein the semiconductor substrate comprises bulk monocrystalline silicon.

34. The method of claim 30 wherein forming the sacrificial oxide comprises atmospheric pressure thermal oxidation.

35. The method of claim 30 wherein the semiconductor substrate comprises bulk monocrystalline silicon, the pad oxide being formed on the monocrystalline silicon, the forming the sacrificial oxide comprising thermal oxidation of the monocrystalline silicon through the pad oxide.

36. The method of claim 30 wherein the sacrificial oxide forming is globally over the array area and the periphery area.

37. The method of claim 30 wherein the sacrificial oxide forming is globally over the substrate.

38. The method of claim 30 wherein the at least one implant is at least a Vt implant.

39. The method of claim 30 wherein the at least one implant is at least a channel enhancement implant.

40. The method of claim 30 wherein the at least one implant is conducted while the periphery area is masked with photoresist.

41. A method of forming an array of FLASH field effect transistors and circuitry peripheral to such array, comprising:

forming active area and field trench isolation oxide relative to a bulk monocrystalline silicon substrate using pad oxide, the pad oxide remaining at least over the active area;

thermally growing a sacrificial oxide proximate the pad oxide over an array area and a periphery area of the monocrystalline silicon substrate;

after thermally growing the sacrificial oxide, first masking the periphery area while leaving the array area exposed, and then conducting at least one conductivity modifying implant into the monocrystalline silicon through the pad oxide and the sacrificial oxide within the array area using said first masking;

after the conductivity modifying implant and using said first masking, etching the sacrificial oxide and the pad oxide from the array area while leaving the sacrificial oxide and the pad oxide over the periphery area;

after etching the sacrificial oxide and the pad oxide from the array area, removing the first masking;

after removing the first masking, forming gate oxide at least within the array area;

after forming the gate oxide, forming a floating gate conductively doped semiconductive material at least within the array area over the gate oxide;

after forming the floating gate conductively doped semiconductive material, forming an oxide layer over the floating gate conductively doped semiconductive material within the array area and within the periphery area over the pad oxide and over the sacrificial oxide, said oxide layer comprising a gate dielectric over the floating gate conductively doped semiconductive material within the array area;

second masking the array area while removing the oxide layer, the pad oxide and the sacrificial oxide from the periphery area using an oxide etching;

after said oxide layer, pad oxide and sacrificial oxide removing, forming a periphery area gate dielectric layer on monocrystalline silicon of the bulk substrate;

after forming the periphery area gate dielectric layer, forming a conductively doped semiconductive material over the array area and the periphery area, and patterning said array area and periphery area semiconductive material into at least some control transistor gate lines within the array area and into at least some non-FLASH transistor gate lines within the periphery area.

42. The method of claim 41 comprising removing the second masking prior to forming the periphery area gate dielectric layer on monocrystalline silicon of the bulk substrate.

43. The method of claim 41 wherein the first masking and the second masking comprises photoresist.

44. The method of claim 41 wherein the at least one conductivity modifying implant is at least a Vt implant.

45. The method of claim 41 wherein the at least one conductivity modifying implant is at least a channel enhancement implant.

46. The method of claim 41 wherein the sacrificial oxide thermally growing is globally over the array area and the periphery area.

47. The method of claim 41 wherein the sacrificial oxide thermally growing is globally over the substrate.

48. The method of claim 41 wherein the periphery area gate dielectric layer is formed to be thicker than the gate oxide within the periphery area.

* * * * *

UNITED STATES PATENT AND TRADEMARK OFFICE
CERTIFICATE OF CORRECTION

PATENT NO. : 6,759,298 B2 Page 1 of 1
APPLICATION NO. : 10/179868
DATED : July 6, 2004
INVENTOR(S) : Lindsay et al.

It is certified that error appears in the above-identified patent and that said Letters Patent is hereby corrected as shown below:

Col. 2, line 44, please insert --step-- after "processing".

Col. 7, line 15, claim 6, please delete "Vt" after "is a" and insert --$V_t$--.

Col. 8, line 18, claim 21, please delete "Vt" after "is a" and insert --$V_t$--.

Col. 8, line 61, claim 30, please delete "Vt" after "one" and insert --$V_t$--.

Col. 8, line 65, claim 31, please delete "Vt" after "any" and insert --$V_t$--.

Col. 9, line 9, claim 32, please delete "Vt" after "one" and insert --$V_t$--.

Col. 9, line 26, claim 38, please delete "Vt" after "at least a" and insert --$V_t$--.

Col. 10, line 39, claim 44, please delete "Vt" after "at least a" and insert --$V_t$--.

Signed and Sealed this

Twenty-eighth Day of July, 2009

JOHN DOLL
*Acting Director of the United States Patent and Trademark Office*